(12) United States Patent
Soltanian et al.

(10) Patent No.: US 8,164,361 B2
(45) Date of Patent: Apr. 24, 2012

(54) LOW POWER COMPLEMENTARY LOGIC LATCH AND RF DIVIDER

(75) Inventors: Babak Soltanian, Santa Clara, CA (US); Jafar Savoj, Santa Clara, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 12/633,281

(22) Filed: Dec. 8, 2009

(65) Prior Publication Data

US 2011/0133781 A1 Jun. 9, 2011

(51) Int. Cl.
*H03K 19/20* (2006.01)
*H03K 19/094* (2006.01)

(52) U.S. Cl. ............ 326/113; 326/40; 326/95; 326/98; 326/115; 327/118; 327/203; 331/52

(58) Field of Classification Search .............. 326/40, 326/93, 95–98, 113, 115; 327/113, 117–118, 327/201–203; 331/50–52
See application file for complete search history.

(56) References Cited

U.S. PATENT DOCUMENTS

| | | | |
|---|---|---|---|
| 5,103,116 A | 4/1992 | Sivilotti et al. | |
| 5,994,935 A | 11/1999 | Ueda et al. | |
| 6,191,629 B1 * | 2/2001 | Bisanti et al. | 327/202 |
| 7,388,416 B2 * | 6/2008 | Marutani | 327/201 |
| 7,768,330 B2 * | 8/2010 | Yuuki et al. | 327/201 |
| 2002/0000834 A1 * | 1/2002 | Ooishi | 326/113 |
| 2004/0036541 A1 * | 2/2004 | Fang et al. | 331/74 |
| 2008/0180139 A1 | 7/2008 | Natonio et al. | |
| 2009/0108885 A1 | 4/2009 | Natonio et al. | |
| 2009/0284288 A1 * | 11/2009 | Zhang et al. | 327/118 |

FOREIGN PATENT DOCUMENTS

| | | |
|---|---|---|
| EP | 0872956 A2 | 10/1998 |
| EP | 1394944 | 3/2004 |
| JP | 5268000 | 10/1993 |

OTHER PUBLICATIONS

International Search Report and Written Opinion—PCT/US2010/059577, ISA/EPO—Apr. 27, 2011.

* cited by examiner

*Primary Examiner* — Jason M Crawford
(74) *Attorney, Agent, or Firm* — Eric Ho

(57) ABSTRACT

A quadrature output high-frequency RF divide-by-two circuit includes a pair of differential complementary logic latches. The latches are interconnected to form a toggle flip-flop. Each latch includes a tracking cell and a locking cell. In a first embodiment, the locking cell includes two complementary logic inverters and two transmission gates. When the locking cell is locked, the two gates are enabled such that the locked (i.e., latched) signal passes through both transmission gates and both inverters. In one advantageous aspect, the tracking cell only involves two transmission gates. Due to the circuit topology, the first embodiment is operable from a low supply voltage at a high operating frequency while consuming a low amount of supply current. In a second and third embodiment, the tracking cell involves a pair of inverters. The sources of the transistors of the inverters are, however, coupled together thereby resulting in performance advantages over conventional circuits.

9 Claims, 16 Drawing Sheets

TRANSPARENT LATCH
FIRST EMBODIMENT

DIVIDE-BY-TWO CIRCUIT

~12 mA SUPPLY CURRENT DISSIPATION
@ 10 GHZ INPUT FREQUENCY
@ 1.3 VOLTS SUPPLY VOLTAGE

CML DIVIDE-BY-TWO CIRCUIT

LATCH

LATCH

TRANSPARENT LATCH
FIRST EMBODIMENT

TRANSPARENT LATCH
FIRST EMBODIMENT

TRACKING MODE
VOP = HIGH
VON = LOW

TRANSPARENT LATCH
FIRST EMBODIMENT

LOCKING MODE
VOP = LOW
VON = HIGH

TRANSPARENT LATCH
SECOND EMBODIMENT

TRANSPARENT LATCH
SECOND EMBODIMENT

TRACKING MODE
VOP = HIGH
VON = LOW

TRANSPARENT LATCH
SECOND EMBODIMENT

LOCKING MODE
VOP = LOW
VON = HIGH

TRANSPARENT LATCH
THIRD EMBODIMENT

TRANSPARENT LATCH
THIRD EMBODIMENT

TRACKING MODE
VOP = HIGH
VON = LOW

TRANSPARENT LATCH
THIRD EMBODIMENT

LOCKING MODE
VOP = LOW
VON = HIGH

|  | MAX. OPERATING FREQUENCY (@ SAME SUPPLY VOLTAGE) | MIN. SUPPLY VOLTAGE (@ SAME OPERATING FREQUENCY) |
| --- | --- | --- |
| EMBODIMENT #1 (FIGS. 9-11) | 2.0 | 1.0 |
| EMBODIMENT #2 (FIGS. 12-14) | 1.5 | 1.0 |
| EMBODIMENT #3 (FIG. 15-17) | 1.0 | 1.2 |

FIG. 20

LOW POWER COMPLEMENTARY LOGIC LATCH AND RF DIVIDER

BACKGROUND INFORMATION

1. Technical Field

The present disclosure relates to high frequency RF divider circuits.

2. Background Information

In many applications dividers that generate In-phase (I) and Quadrature (Q) signals are desired. FIG. 1 (Prior Art) is a diagram of a divide-by-two circuit 1. Circuit 1 includes two latches 2 and 3 that are interconnected to form a toggle flip-flop. The input clock signal is a differential signal, denoted here as involving signals VOP and VON. The I output signal is a differential output signal involving signals IP and IN. The Q output signal is also a differential output signal involving signals QP and QN. The I and Q signals are ninety degrees out of phase with respect to one another. There are several known ways to realize the latches 1 and 2 of FIG. 1.

FIG. 2 (Prior Art) is a diagram of a divider of the type of FIG. 1, realized using CML (Common Mode Logic) latches. FIG. 3 (Prior Art) is a diagram of a complementary logic latch 4 of a type usable in the divide-by-two circuit of FIG. 1. "Complementary logic", which refers to logic circuitry involving both P-channel and N-channel transistors, is often more commonly referred to as CMOS (Complementary Metal Oxide Semiconductor) logic even though the transistors making up the logic circuitry may not have metal gates and may not have oxide gate dielectrics. FIG. 4 (Prior Art) is a diagram of another type of complementary logic latch 5 usable to realize the latches of the divider of FIG. 1.

Each of the latches of FIG. 2, FIG. 3 and FIG. 4 has its advantages and disadvantages in terms of maximum operating frequency, implementation size, rail-to-rail output voltage swing operation, output signal noise, minimum supply voltage, and power consumption. For example, the CML latch example of FIG. 2 is operable at a 10 GHz input clock frequency and at relatively low supply voltages and is therefore often preferable in a high speed divider application in a cellular telephone local oscillator. The circuit, however, unfortunately consumes a large amount of supply current in a range of approximately 12 milliamperes. To prevent the divider from introducing too much noise for the cellular telephone application mentioned above, the pullup load resistances 6-9 are made small. In the illustrated example, the pull-up load resistances 6-9 are 200 ohms. Due to the small pullup load resistances, however, the pull-down transistors 10-19 are generally sized larger to provide adequate current flow over resistances 6-9 such that the divider will output signals having adequate output signal voltage swings. The complementary logic latch circuit of FIG. 3 also has disadvantages. For example, when the inverter involving transistors 20 and 21 is enabled and is to switch, the output signal current must flow through the on-resistances of enable transistors 22 and 23. Voltage drops across these enable transistors limit low supply voltage operation of the circuit. To reduce the on-resistance of the enable transistors, the transistors are generally made larger if high operating speed is required and if low supply voltage operation is required. The latch of FIG. 4 is even larger and slower than the latch of FIG. 3. Moreover, due to the many switching logic elements, the latch of FIG. 4 consumes an undesirably large amount of supply current when operating at high frequencies.

SUMMARY

A complementary logic high-frequency RF divide-by-two circuit includes a pair of differential complementary logic latches. The latches are interconnected to form a toggle flip-flop. A differential signal output by one of the latches is usable as an In-phase (I) signal whereas a differential signal output by the other of the latches is usable as a Quadrature (Q) signal. Each latch includes a tracking cell and a locking cell.

In a first embodiment, the locking cell includes a pair of complementary logic inverters and a pair of transmission gates. When the locking cell is locked, the pair of transmission gates is enabled such that a first of the transmission gates communicates a signal output by a first of the inverters to an input of the second inverter, and such that the second transmission gate communicates a signal output by the second inverter back to the input of the first inverter. The locked (i.e., latched) signal passes through two transmission gates in its feedback path. In one advantageous aspect, the tracking cell only involves two transmission gates. In a tracking mode, a first of the transmission gates of the tracking cell is enabled and communicates a first input signal from a first latch input node to an input of the first inverter of the locking cell. In the tracking mode, a second of the transmission gates of the tracking cell is enabled and communicates a second input signal from a second latch input node to an input of the second inverter of the locking cell. Due to the circuit topology, the first embodiment is operable from a low supply voltage (for example, 1.3 volts) at a high operating frequency (for example, 10 GHz) while consuming a low amount of supply current (for example, 1.0 mA).

In a second embodiment and a third embodiment, the locking cell includes a pair of cross-coupled complementary logic inverters that can be enabled in the locking mode and disabled in the tracking mode. The tracking cell includes a pair of complementary logic inverters. A first of the inverters of the tracking cell drives a first input node of the locking cell if the latch is in the tracking mode, and a second of the inverters of the tracking cell drives a second input node of the locking cell if the latch is in the tracking mode. In one advantageous aspect, the sources of the P-channel transistors of the inverters of the tracking cell are coupled together, and the sources of the N-channel transistors of the inverters of the tracking cell are also coupled together.

In the second embodiment, the sources of the P-channel transistors of the inverters of the tracking cell are directly connected to a supply voltage conductor and the sources of the N-channel transistors of the inverters of the tracking cell are directly connected to a ground conductor. These direct connections and the associated topology of the tracking cell that makes the direct connections possible improves signal headroom and footroom, and allows the latch to operate at relatively low supply voltages.

In the third embodiment, the sources of the inverters of the tracking cell are coupled to the supply voltage conductor and to the ground conductor through enable transistors, but there is only one P-channel transistor that couples the sources of the P-channel transistors of the inverters to the supply voltage conductor and there is only one N-channel transistor that couples the sources of the N-channel transistors of the inverters to the ground conductor. As a result of this topology, each of the enable transistors can be made larger than a comparable circuit that uses multiple enable transistors for the same enable purpose. The third embodiment has a speed advantage over conventional dividers of similar topology for a given implementation size.

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advan-

BRIEF DESCRIPTION OF THE DRAWINGS

FIG. 20 is a table of comparative performance parameters for the first embodiment of FIG. 9, for the second embodiment of FIG. 12, and for the third embodiment of FIG. 15.

DETAILED DESCRIPTION

Figure 5:
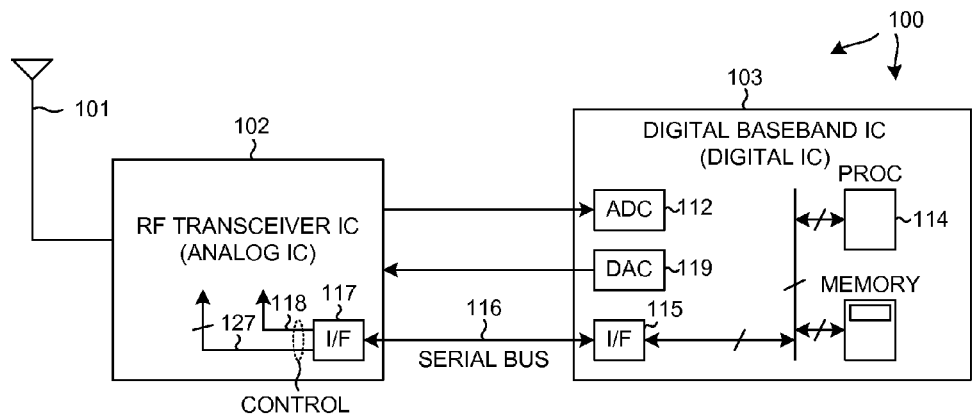
FIG. 5 is a high-level simplified diagram of one example of a device that includes a novel divide-by-two circuit.

FIG. 5 is a diagram of an example of a device that includes a novel divider circuit. The device is a mobile communication device 100. The novel divider circuit is, however, a circuit of general applicability and is usable in other radio circuits, including Wireless Local Area Network (WLAN) radio circuits, and other circuits other than radio circuits. Mobile communication device 100 in the example described below is a cellular telephone. Device 100 includes (among other parts not illustrated) an antenna 101 usable for receiving and transmitting cellular telephone communications, an RF transceiver integrated circuit 102, and a digital baseband integrated circuit 103.

Figure 6:
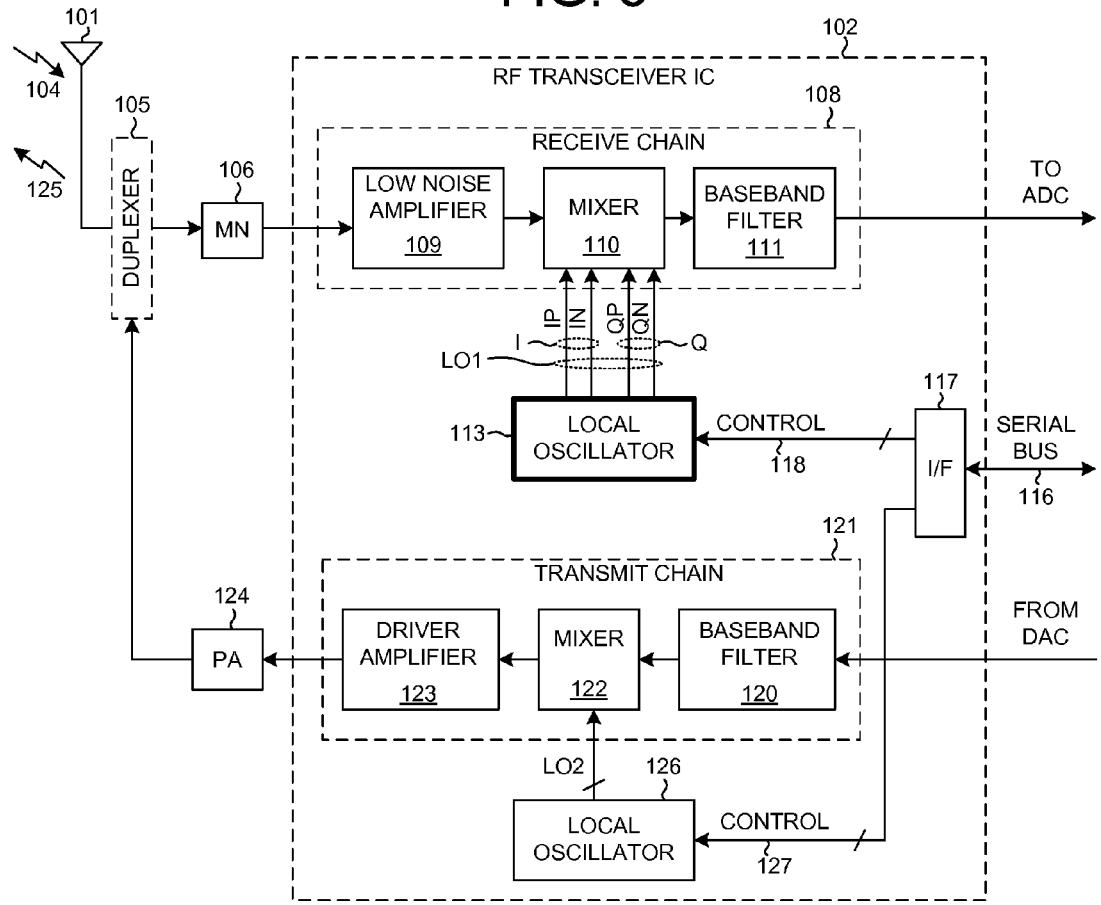
FIG. 6 is a more detailed diagram of the RF transceiver integrated circuit of FIG. 5.

FIG. 6 is a more detailed diagram of the RF transceiver integrated circuit 102 of FIG. 5. In one very simplified explanation of the operation of device 100, if device 100 is being used to receive audio information as part of a cellular telephone conversation, then an incoming transmission 104 is received on antenna 101. The signal passes through a duplexer 105 and a matching network 106 and is processed by a receive chain 108 of RF transceiver integrated circuit 102. The signal is amplified by a Low Noise Amplifier 109, and is downconverted by a mixer 110. The downconverted signal is filtered by baseband filter 111. After being digitized by an Analog-to-Digital Converter (ADC) 112, and being demodulated and decoded in digital baseband integrated circuit 103, the resulting audio information may, for example, be used to drive a speaker (not shown) such that a user of device 1 can hear another speaker in the cellular telephone conversation. The receiver is tuned by adjusting the frequency of a local oscillator signal (LO1) supplied by a local oscillator 113 to mixer 110. The LO1 signal involves an In-phase signal I and a Quadrature signal Q. Each of the I and Q signals is a differential signal. A processor 114 in digital baseband integrated circuit 103 controls the local oscillator 113 and the frequency of LO1 by sending control information to the local oscillator 113 via serial bus interface 115, serial bus 116, serial bus interface 117, and control signal lines 118.

If, on the other hand, device 100 is to be used to transmit to audio information as part of the cellular telephone conversation, then a microphone (not shown) that is part of device 100 receives sound and converts that sound into an electrical signal. The electrical signal is converted into a stream of digital values that carry the audio information. This digitized audio information is encoded and modulated in digital baseband integrated circuit 103. It is then converted into analog form by a Digital-to-Analog Converter (DAC) 119 in digital baseband integrated circuit 103. The resulting analog signal is filtered by a baseband filter 120 of a transmit chain 121 of RF transceiver integrated circuit 102. After being upconverted by a mixer 122 and being amplified by a driver amplifier 123 and a power amplifier 124, the signal is transmitted from antenna 101 as transmission 125. The transmitter is controlled by adjusting the frequency of another local oscillator signal LO2. Local oscillator signal LO2 is supplied by a local oscillator 126 to mixer 122. Like the local oscillator signal LO1 used by the transmit chain, the LO2 signal used by the transmit chain is controlled by processor 114 in digital baseband integrated circuit 103. To control LO2, processor 114 sends control information to local oscillator 126 via serial bus interface 115, serial bus 116, serial bus interface 117, and control signal lines 127.

Figure 7:
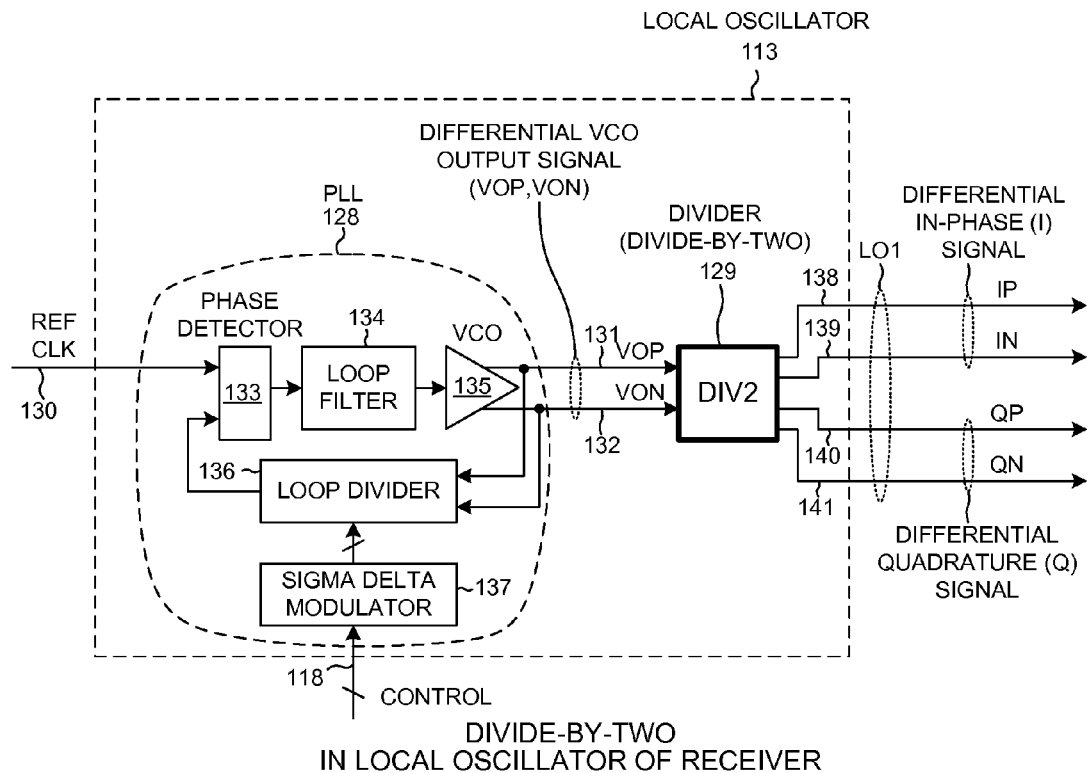
FIG. 7 is a more detailed diagram of a local oscillator 113 of the RF transceiver integrated circuit 102 of FIG. 6.

FIG. 7 is a more detailed diagram of local oscillator 113. Local oscillator 113 involves a Phase-Locked Loop (PLL) 128 and a divider 129. PLL 128 receives a reference clock signal via conductor 130 and based on the control information received via control lines 118 generates a differential VCO output signal on conductors 131 and 132. The differential VCO output signal involves a signal VOP on conductor 131 and a signal VON on conductor 132. PLL 128, in this particular example, involves a phase detector 133, a loop filter 134, a Voltage-Controlled Oscillator (VCO) 135, a loop divider 136, and a sigma delta modulator 137. The letters "VO" in the signal names VOP and VON indicate "VCO output". The letter "P" indicates a positive signal, whereas the letter "N" indicates a negative signal. Divider 129 frequency-divides by two, and outputs the local oscillator signal LO1 of FIG. 6. As illustrated in FIG. 7, LO1 includes differential in-phase signal I on conductors 138 and 139 and also includes differential quadrature signal Q on conductors 140 and 141. The frequencies of the I and Q signals as output by divider 129 are half of the frequency of the differential VCO output signal received into divider 129. The phase of the signal Q is ninety degrees out of phase with respect to the phase of the signal I.

Figure 8:
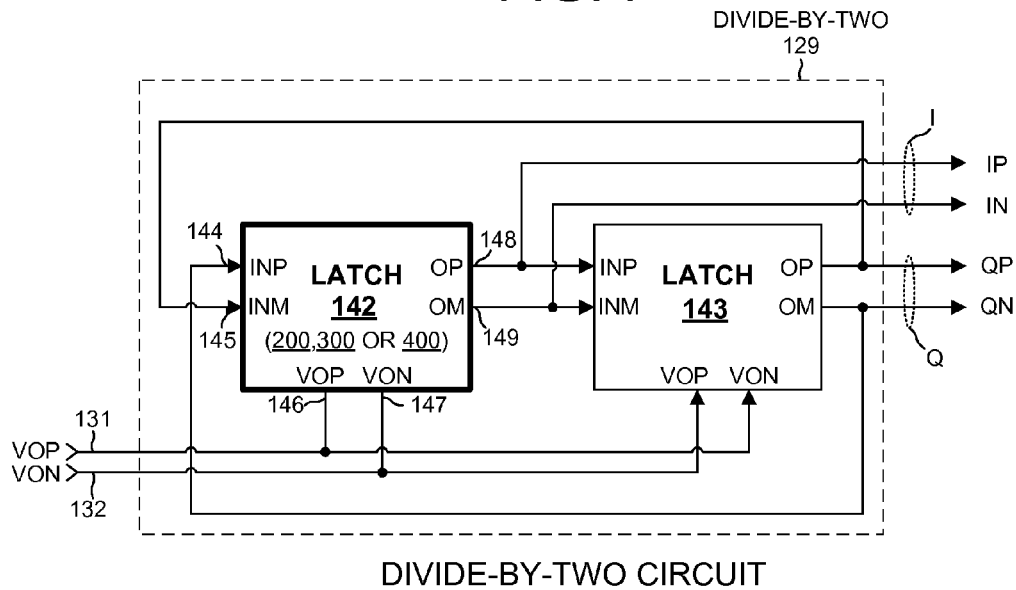
FIG. 8 is a more detailed diagram of a divide-by-two circuit 129 in the local oscillator 113 of FIG. 7.

FIG. 8 is a more detailed diagram of divider 129 of FIG. 7. Divider 129 includes two transparent latches 142 and 143. Each of the transparent latches receives a differential data input signal [INP,INM] and a differential input clock signal [VOP,VON] and outputs a differential output data signal [OP, OM]. Transparent latch 142, for example, receives a differential data input signal on a first data input node INP 144 and a second data input node INM 145. Latch 142 receives a differential clock signal on a first clock input node VOP 146 and a second clock input node VON 147. Latch 142 outputs the differential data signal on a first data output node OP 148 and a second data output node OM 149. Transparent latches 142 and 143 are of identical construction, but are latched by opposite levels of the incoming clock signal VOP,VON. Each transparent latch includes a locking cell and a tracking cell. The latches 142 and 143 are connected together to form a toggle flip-flop, and a toggle flip-flop frequency-divides by two. Three embodiments of transparent latch 142 are set forth below. The first embodiment 200 is set forth in FIGS. 9-11. The second embodiment 300 is set forth in FIGS. 12-14. The third embodiment 400 is set forth in FIGS. 15-17.

Figure 9:
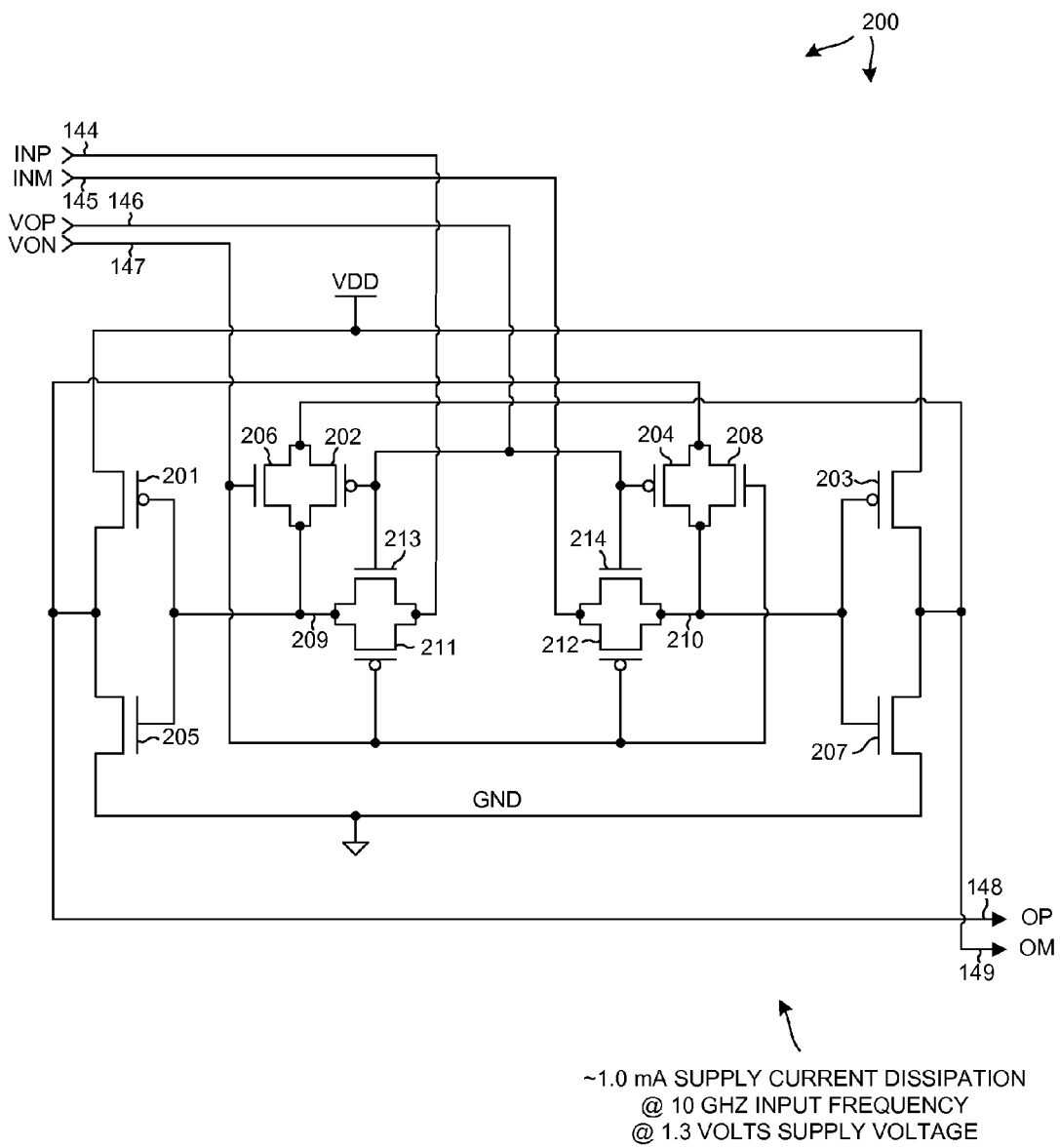
FIG. 9 is a circuit diagram of a first embodiment of a transparent latch of the divide-by-two circuit 129 of FIG. 8.

FIG. 9 is a diagram of the first embodiment 200 of transparent latch 142 of FIG. 8. The latch includes a locking cell and a tracking cell. The locking cell includes P-channel field effect transistors 201-204 and N-channel field effect transistors 205-208. Transistors 201 and 205 are connected to form a first complementary logic inverter. Transistors 203 and 207 are connected to form a second complementary logic inverter.

Transistors 202 and 206 are connected to form a first transmission gate. Transistors 204 and 208 are connected to form a second transmission gate. Node 209 is a first input node of the locking cell. Node 210 is a second input node of the locking cell. Node 148, in addition to being an output node of the latch, is a first output node of the locking cell. Node 149, in addition to being an output node of the latch, is a second output node of the locking cell. The first transmission gate is coupled between the second output node 149 of the locking cell and the first input node 209 of the locking cell. The second transmission gate is coupled between the first output node 148 of the locking cell and the second input node 210 of the locking cell. The first inverter involving transistors 201 and 205 has an input at node 209 and has an output at node 148. The second inverter involving transistors 203 and 207 has an input at node 201 and an output at node 149.

The transparent latch of FIG. 9 also includes a tracking cell. The tracking cell includes P-channel field effect transistors 211 and 212 and N-channel field effect transistors 213 and 214. Transistors 211 and 213 are connected to form a transmission gate coupled between first input node 144 of the latch and first input node 209 of the locking cell. Transistors 212 and 214 are connected to form a transmission gate coupled between second input node 145 of the latch and second input node 210 of the locking cell.

Figure 10:
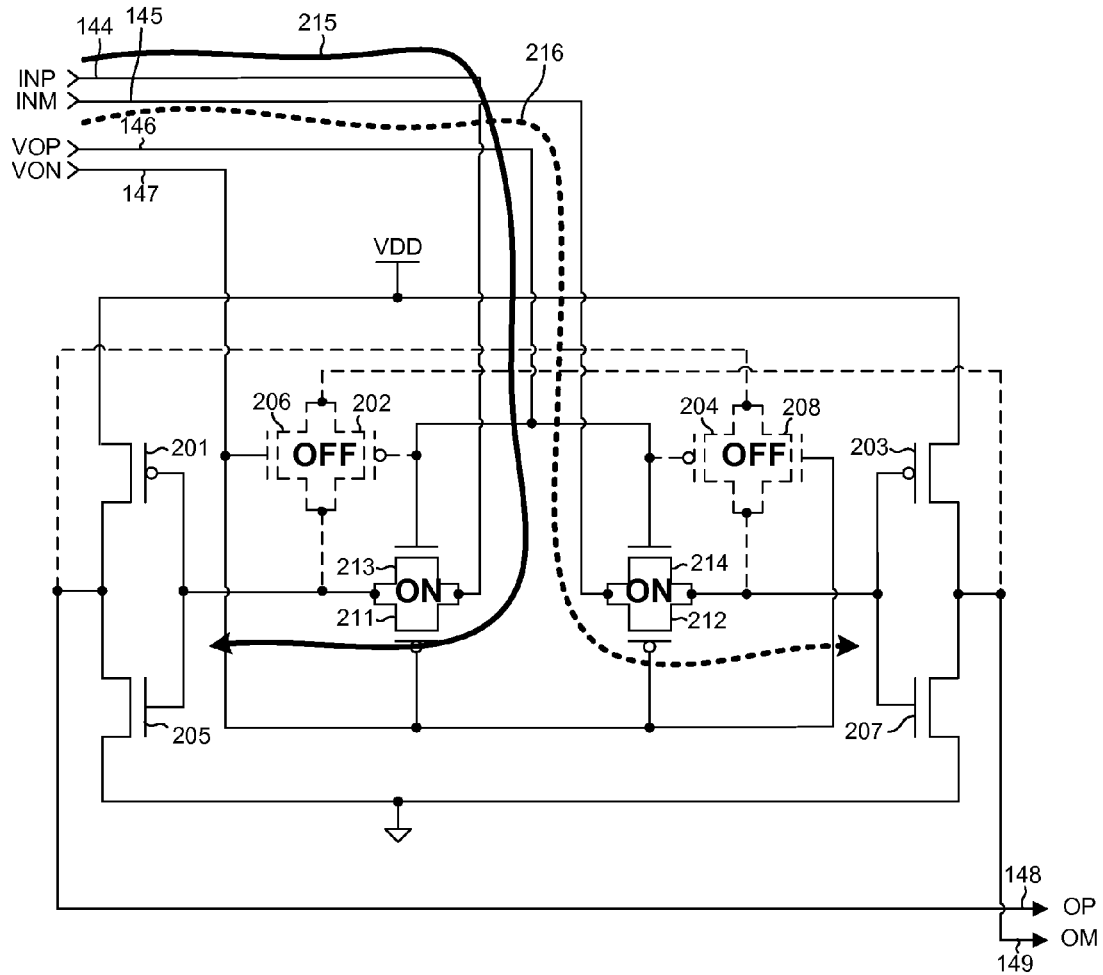
FIG. 10 is a circuit diagram that illustrates operation of the latch of FIG. 9 in the tracking mode.

Operation of the transparent latch of FIG. 9 is explained in connection with FIG. 10 and FIG. 11. As illustrated, in the tracking mode signal VOP is high and signal VON is low. The transmission gates of the locking cell involving transistors 202, 206, 204 and 208 are off. The transmission gates of the tracking cell involving transistors 211, 213, 212 and 214 are on. The signal INP on input node 144 passes through the transmission gate involving transistors 213 and 211 as illustrated by arrow 215. The signal is inverted by the first inverter involving transistors 201 and 205 and an inverted version of the signal is driven onto output node 148 as output signal OP. Similarly, the signal INM on input node 145 passes through the transmission gate involving transistors 212 and 214 as illustrated by arrow 216. The signal is inverted by the second inverter involving transistors 203 and 207 and an inverted version of the signal is driven onto output node 149 as output signal OM. The latch is said to be transparent because the differential input signal passes through the latch, albeit in inverted form. The output of the latch is said to "track" the input.

Figure 11:
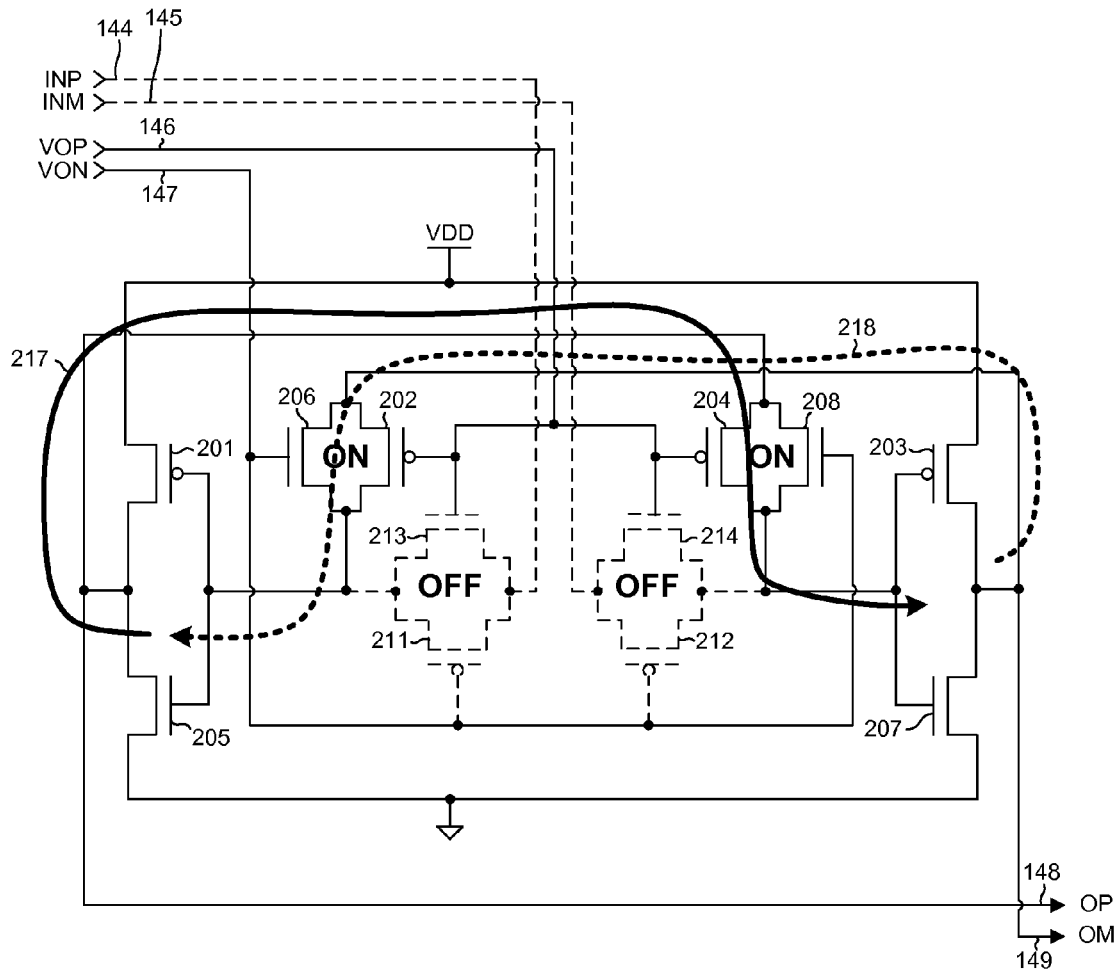
FIG. 11 is a circuit diagram that illustrates operation of the latch of FIG. 9 in the locking mode.

FIG. 11 illustrates operation of the latch in the locking mode. As illustrated, in the locking mode signal VOP is low and signal VON is high. The transmission gates of the tracking cells are off, and the transmission gates of the locking cell are on. As illustrated by arrow 217, the signal output by the first inverter is therefore communicated through a transmission gate to the input of the second inverter. As illustrated by arrow 218, the output of the second inverter is communicated through a transmission gate to the input of the first inverter. The latched feedback signal therefore passes through two transmission gates. The inverters are coupled together to be a cross-coupled inverter pair. The inverters of the locking cell drive signals onto the output nodes 148 and 149 of the latch in both the tracking mode and the locking mode.

As the differential input clock signal VOP and VON received from the VCO 135 (see FIG. 7) transitions logic states, the toggle flip-flop structure of FIG. 8 toggles at half the frequency of the input signal. The signals I and Q are therefore of a frequency that is half of the frequency of the differential input clock signal VOP and VON. Because latches 142 and 143 track during different half-cycles of the incoming clock signal, the output signals I and Q are in quadrature relation to one another. Although transmission gates are used to realize switches, in other examples single transistors can be used to realize switches.

Figure 12:
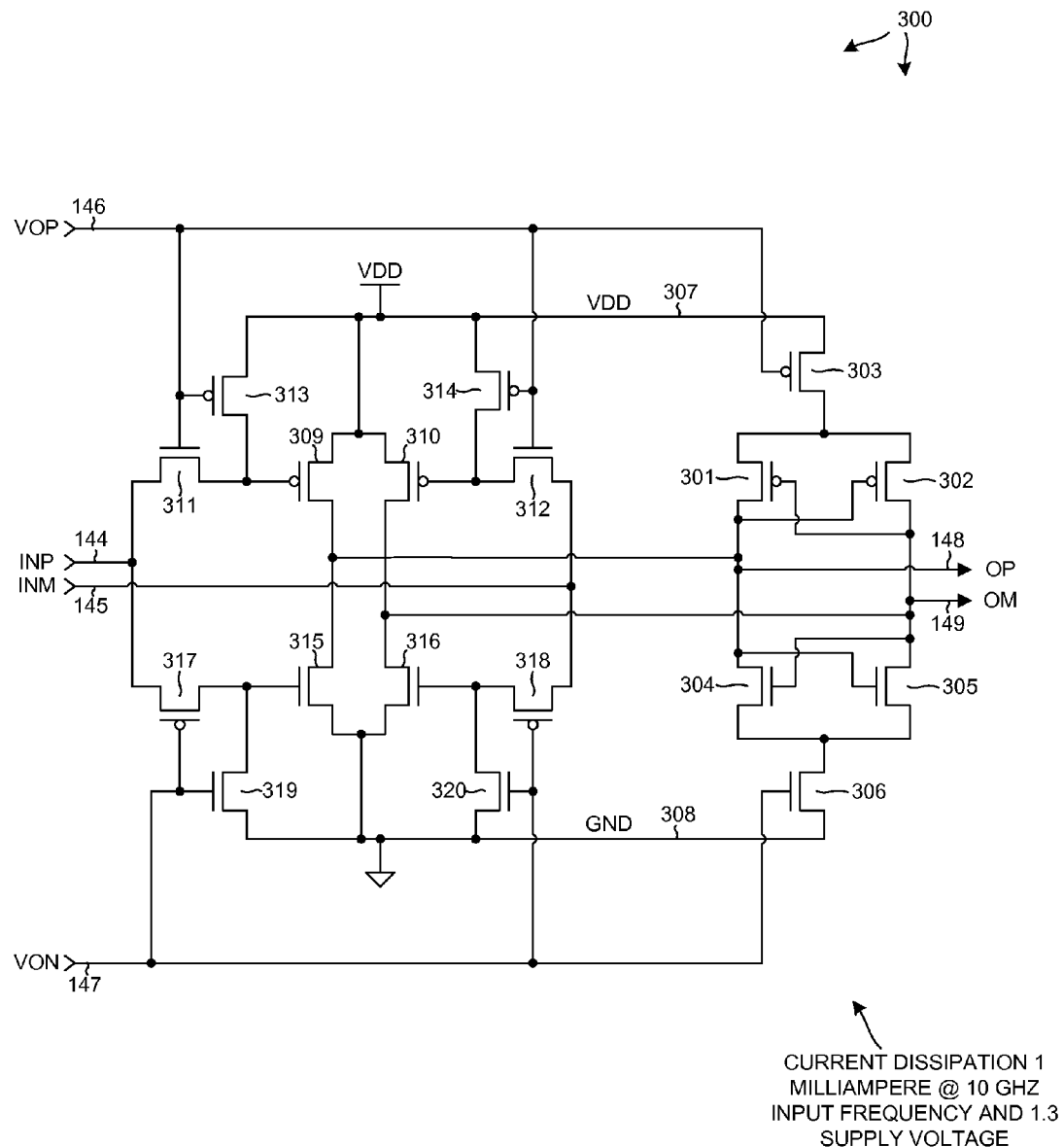
FIG. 12 is a circuit diagram of a second embodiment of a transparent latch of the divide-by-two circuit of FIG. 8.

FIG. 12 is a diagram of the second embodiment 300 of transparent latch 142 of FIG. 8. The latch includes a locking cell and a tracking cell. The locking cell includes P-channel field effect transistors 301-303 and N-channel field effect transistors 304-306. Transistors 301 and 304 are connected to form a first complementary logic inverter. Transistors 302 and 305 are connected to form a second complementary logic inverter. The first and second inverters are coupled together in cross-coupled fashion, with the transistors 303 and 306 serving as enable signal inputs. If enable transistors 303 and 306 are on, then the cross-coupled inverters are on and operate as a cross-coupled latch. If the enable transistors 303 and 306 are off, then the sources of P-channel transistors 301 and 302 are not coupled to supply voltage conductor 307, and then the sources of N-channel transistors 304 and 305 are not coupled to ground conductor 308. No source-to-drain current can flow through the transistors of the cross-coupled inverters, and the transistors of the locking cell are off.

The tracking cell includes P-channel field effect transistors 309, 310, 313, 314, 317, 318 and N-channel field effect transistors 311, 312, 315, 316, 319, 320. Transistors 309 and 315 are connected to form a first inverter. If input signal VOP is high and input signal VON is low, then the gates of transistors 309 and 315 are both coupled to the input node 144. The first inverter inverts the signal INP and outputs an inverted version of signal INP onto node 148. If, however, input signal VOP is low and input signal VON is high, then the gates of transistors 309 and 315 are not coupled to input node 144. Rather the gate of P-channel transistor 309 is coupled via transistor 313 to supply voltage conductor 307 such that P-channel transistor 309 is off. Also, the gate of N-channel transistor 315 is coupled via transistor 319 to ground conductor 308 such that N-channel transistor 315 is off. Because both the P-channel and the N-channel transistors 309 and 315 are off, the first inverter is disabled and does not drive a signal onto node 148.

Transistors 310 and 316 are similarly connected to form a second inverter. If input signal VOP is high and input signal VON is low, then the gates of transistors 310 and 316 are both coupled to the input node 145. The second inverter inverts the signal INM and outputs an inverted version of signal INM onto node 149. If, however, input signal VOP is low and input signal VON is high, then the gates of transistors 310 and 316 are not coupled to input node 145. Rather the gate of P-channel transistor 310 is coupled via transistor 314 to supply voltage conductor 307 such that P-channel transistor 310 is off. Also, the gate of N-channel transistor 316 is coupled via transistor 320 to ground conductor 308 such that N-channel transistor 316 is off. Because both the P-channel and the N-channel transistors 310 and 316 are off, the second inverter is disabled and does not drive a signal onto node 149.

Figure 13:
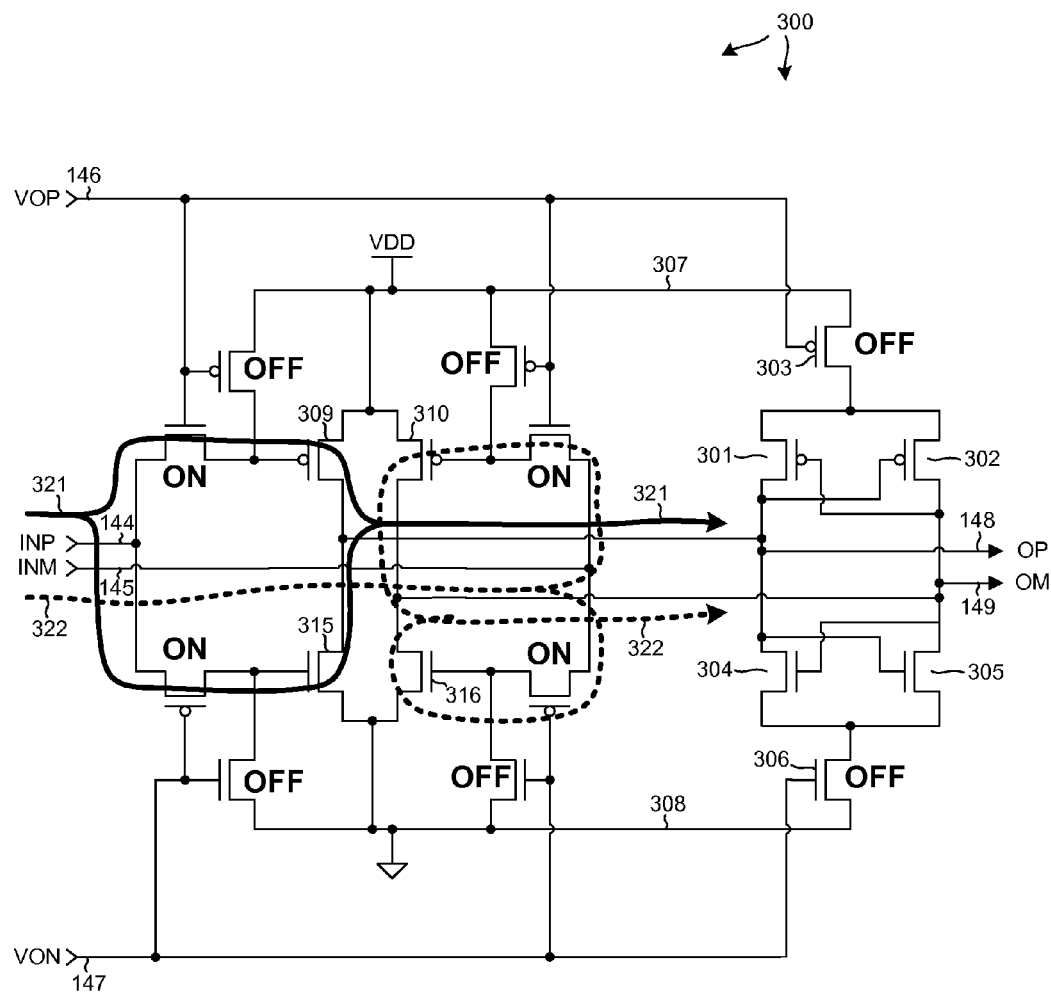
FIG. 13 is a circuit diagram that illustrates operation of the latch of FIG. 12 in the tracking mode.

Operation of the transparent latch of FIG. 12 is explained in connection with FIG. 13 and FIG. 14. As illustrated, in the tracking mode signal VOP is high and signal VON is low. The inverters of the tracking cell are both enabled, and the cross-coupled inverter structure of the locking cell is disabled. The input signal INP on node 144 is inverted by the first inverter of the tracking cell involving transistors 309 and 315. The first inverter drives an inverted version of the input signal INP onto node 148 as indicated by the arrow 321. The input signal INM on node 145 is inverted by the second inverter of the tracking cell involving transistors 310 and 316. The second inverter drives an inverted version of the input signal INM onto node 149 as indicated by the arrow 322. The latch is said to be transparent because the differential input signal on input nodes 144 and 145 passes through the latch, albeit in inverted form. The output of the latch is said to "track" the input. The locking cell is disabled because transistors 303 and 306 are off.

Figure 14:
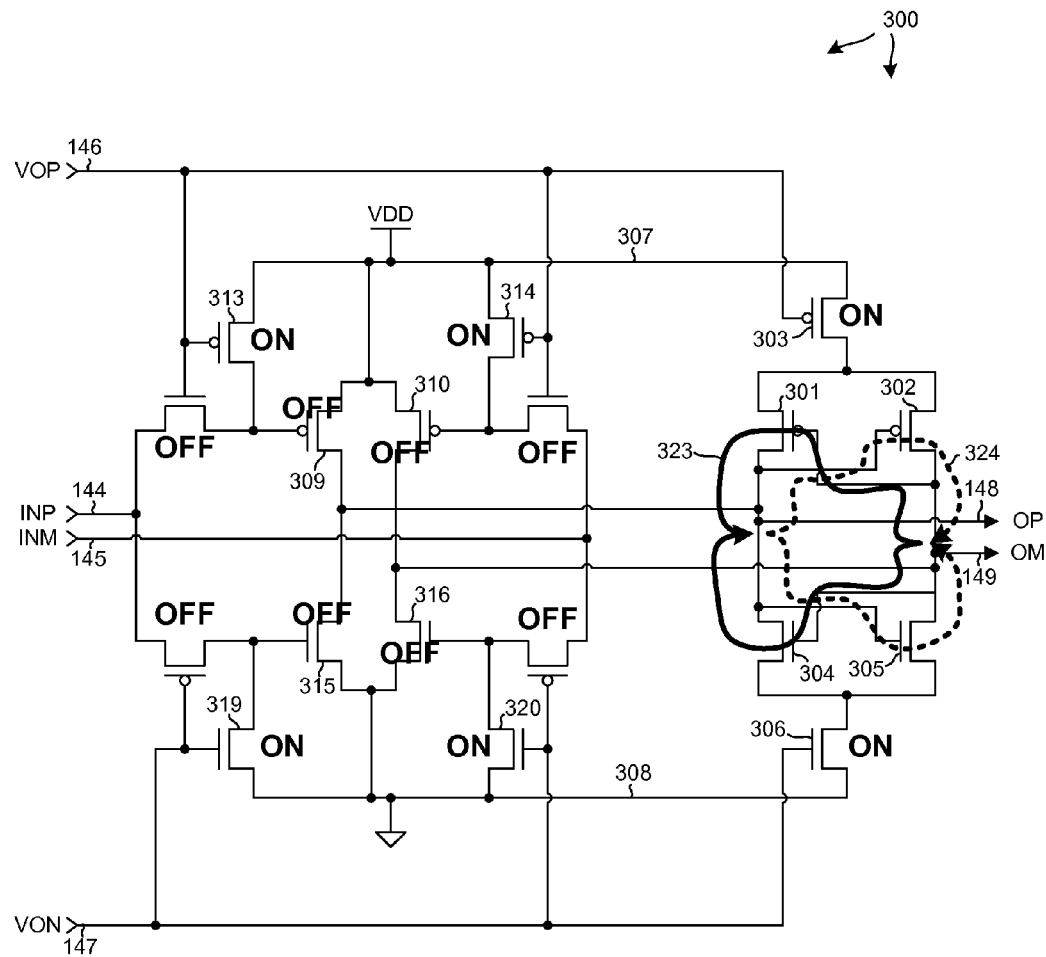
FIG. 14 is a circuit diagram that illustrates operation of the latch of FIG. 12 in the locking mode.

FIG. 14 illustrates operation of the latch in the locking mode. As illustrated, in the locking mode signal VOP is low and signal VON is high. The first and second inverters of the tracking cell are disabled. The first and second inverters of the tracking cell are therefore not driving nodes 148 and 149. The gates of the N-channel transistors 315 and 316 of the inverters of the tracking cell are coupled via transistors 319 and 320 to ground node 308, thereby turning transistors 315 and 316 off. Similarly, the gates of the P-channel transistors 309 and 310 of the inverters of the tracking cell are coupled via transistors 313 and 314 to supply voltage node 307, thereby turning transistors 309 and 310 off. In contrast to how the inverters of the tracking cell are disabled, the cross-coupled inverters of the locking cell are enabled by virtue of transistors 303 and 306 being on. The signals on nodes 148 and 149 are therefore latched and held on nodes 148 and 149, respectively. The solid arrow 323 represents signal flow from the input of the inverter involving transistors 301 and 304 to the output of that inverter at node 148. The dashed arrow 324 represents signal flow from the input of the inverter involving transistors 302 and 305 to the output of that inverter at node 149.

Figure 15:
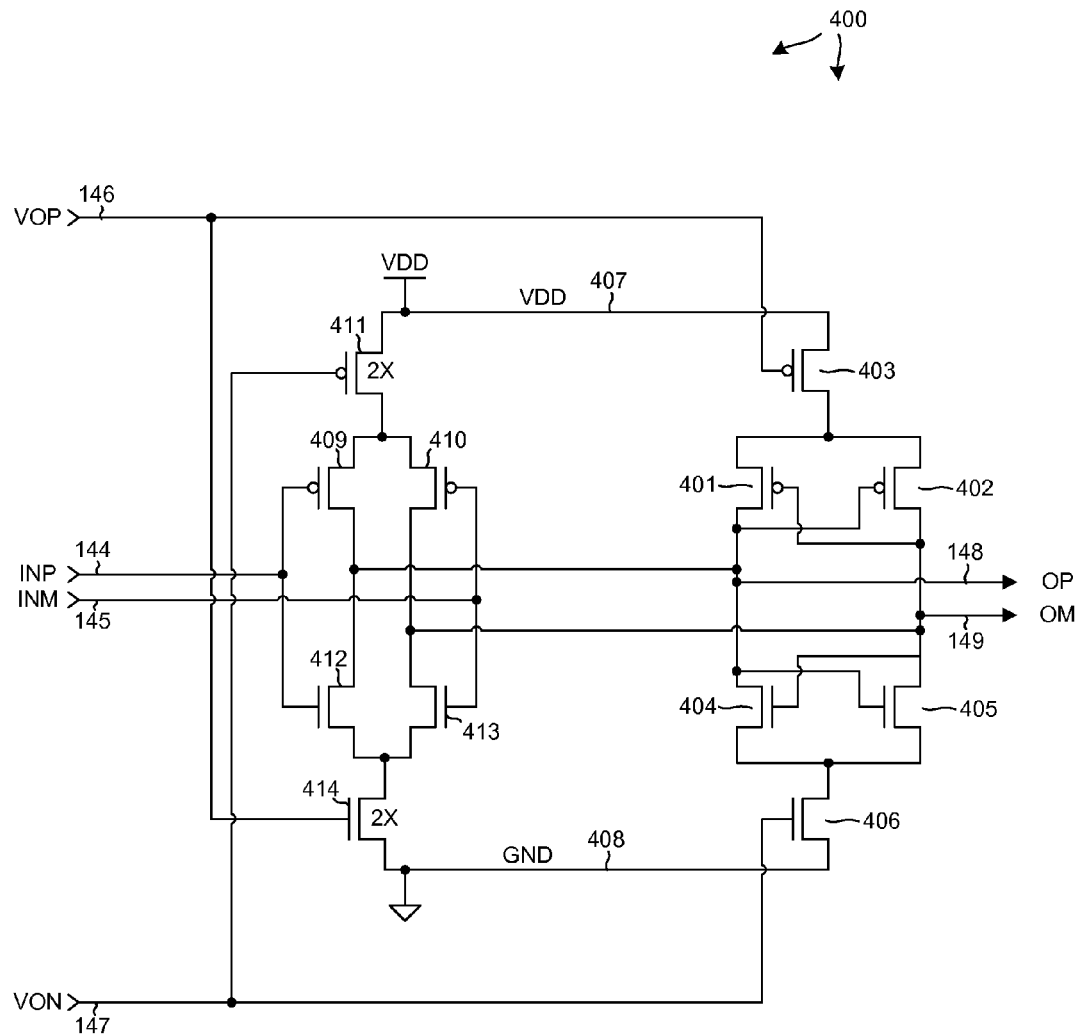
FIG. 15 is a circuit diagram of a third embodiment of a transparent latch of the divide-by-two circuit of FIG. 8.

FIG. 15 is a diagram of the third embodiment 400 of transparent latch 142 of FIG. 8. The latch includes a locking cell and a tracking cell. The locking cell is identical to the locking cell of the second embodiment 300 of FIG. 12 and includes P-channel field effect transistors 401-403 and N-channel field effect transistors 404-406. Transistors 401 and 404 are connected to form a first complementary logic inverter. Transistors 402 and 405 are connected to form a second complementary logic inverter. The first and second inverters are coupled together in cross-coupled fashion, with the transistors 403 and 406 serving as enable transistors. If VOP is low and VON is high, then enable transistors 403 and 406 are on and the cross-coupled inverters are enabled and operate as a cross-coupled latch. If VOP is high and VON is low, then enable transistors 403 and 406 are off and the sources of P-channel transistors 401 and 402 are not coupled to supply voltage conductor 407, and the sources of N-channel transistors 404 and 405 are not coupled to ground conductor 408. No source-to-drain current can flow through the transistors of the cross-coupled inverters, and the cross-coupled inverters of the locking cell are off.

The tracking cell includes P-channel field effect transistors 409-411 and N-channel field effect transistors 412-414. Transistors 409 and 412 are connected to form a first inverter. The sources of transistors 409 and 410 are coupled together and to the drain of enable transistor 411. Transistors 410 and 413 are connected to form a second inverter. The sources of transistors 412 and 413 are coupled together and to the drain of enable transistor 414. If input signal VOP is high and input signal VON is low, then enable transistors 411 and 414 are on and the inverters of the tracking cell are enabled. If input signal VOP is low and input signal VON is high, then enable transistors 411 and 414 are off and the inverters of the tracking cell are disabled.

Figure 16:
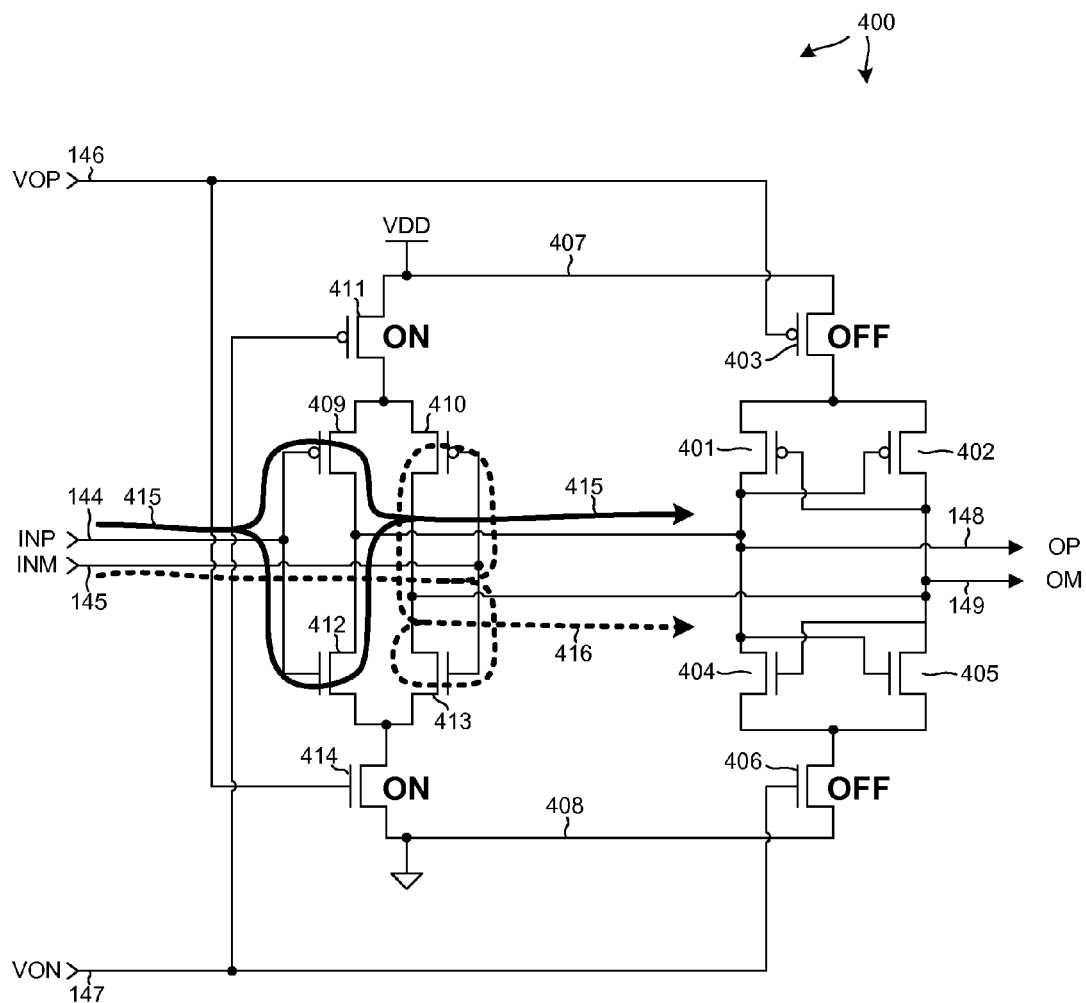
FIG. 16 is a circuit diagram that illustrates operation of the latch of FIG. 15 in the tracking mode.

Operation of the transparent latch of FIG. 15 is explained in connection with FIG. 16 and FIG. 17. As illustrated in FIG. 16, in the tracking mode signal VOP is high and signal VON is low. The inverters of the tracking cell are both enabled, and the cross-coupled inverter structure of the locking cell is disabled. The input signal INP on node 144 is inverted by the first inverter of the tracking cell involving transistors 409 and 412. The first inverter drives an inverted version of the input signal INP onto node 148 as indicated by the arrow 415. The input signal INM on node 145 is inverted by the second inverter of the tracking cell involving transistors 410 and 413. The second inverter drives an inverted version of the input signal INM onto node 149 as indicated by the arrow 416. The latch is said to be transparent because the differential input signal on input nodes 144 and 145 passes through the latch, albeit in inverted form. The output of the latch is said to "track" the input. The locking cell is disabled because transistors 403 and 406 are off.

Figure 17:
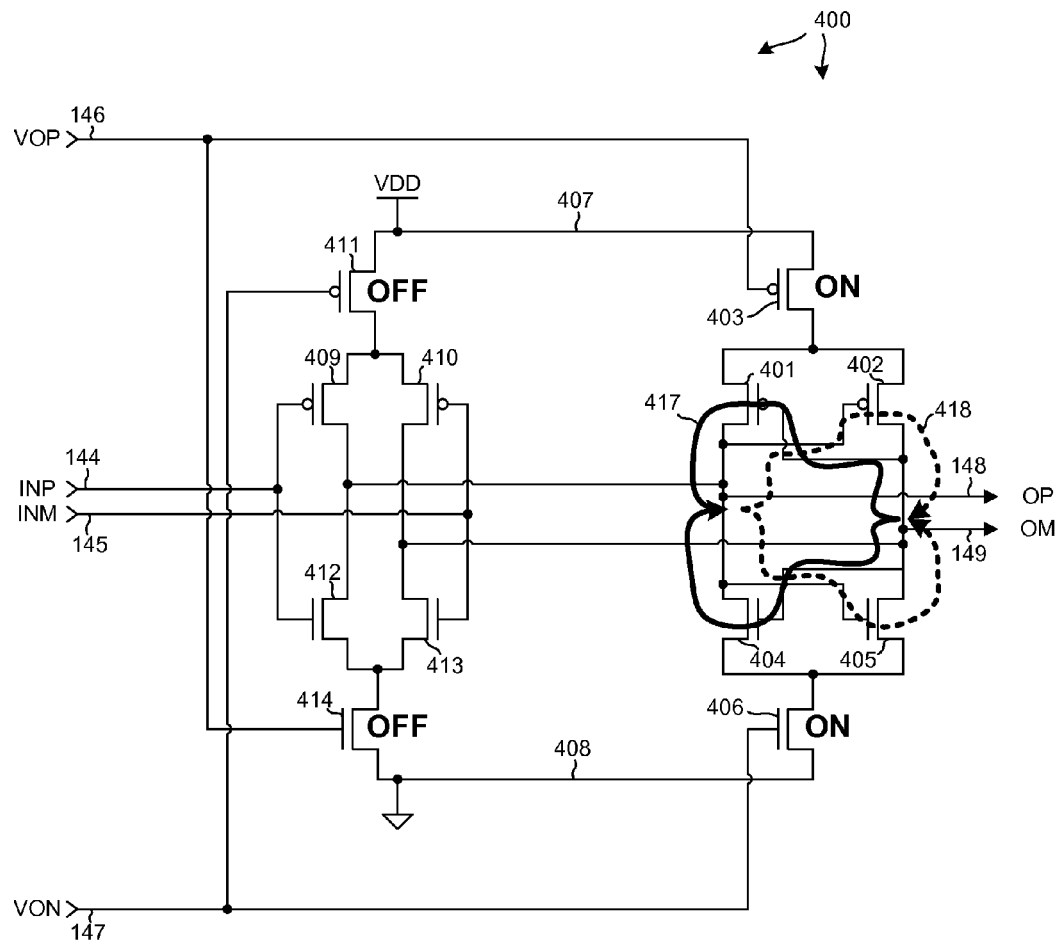
FIG. 17 is a circuit diagram that illustrates operation of the latch of FIG. 15 in the locking mode.

FIG. 17 illustrates operation of the latch in the locking mode. In the locking mode signal VOP is low and signal VON is high. The first and second inverters of the tracking cell are disabled because enable transistors 411 and 414 are off. The first and second inverters of the tracking cell are therefore not driving nodes 148 and 149. In contrast to how the inverters of the tracking cell are disabled, the cross-coupled inverters of the locking cell are enabled by virtue of transistors 403 and 406 being on. The signals on nodes 148 and 149 are therefore latched and held on nodes 148 and 149, respectively. The solid arrow 417 represents signal flow from the input of the inverter involving transistors 401 and 404 to the output of that inverter at node 148. The dashed arrow 418 represents signal flow from the input of the inverter involving transistors 402 and 405 to the output of that inverter at node 149.

Figure 18:
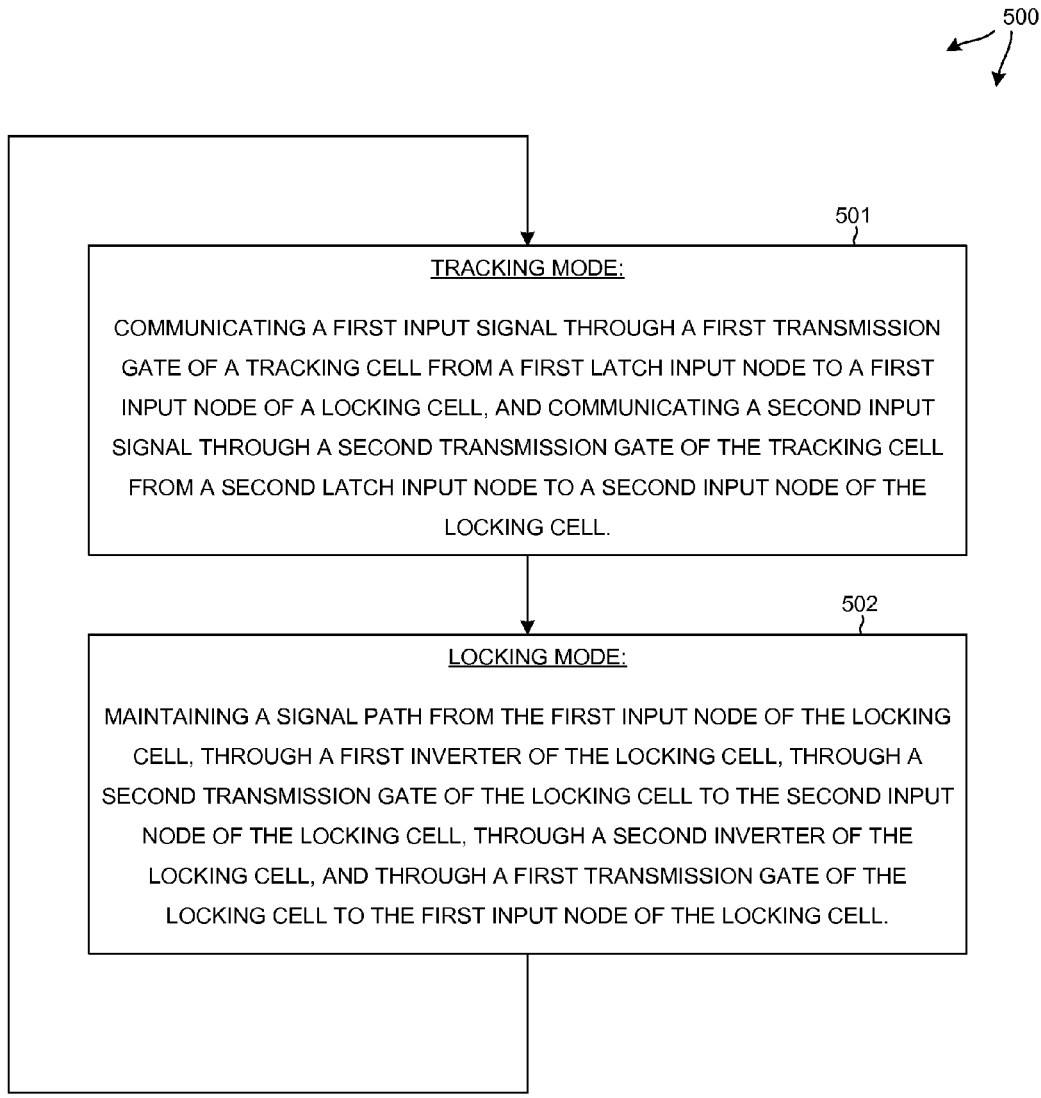
FIG. 18 is a flowchart of a method 500 of operation of the first embodiment of FIG. 9.

FIG. 18 is a flowchart of a method 500 of operation of the first embodiment of FIG. 9. In the tracking mode, the first signal (for example, INP) is communicated (step 501) through a first transmission gate (for example, 211, 213) of the tracking cell from the first latch input node (for example, 144) to a first input node (for example, 209) of the locking cell, and the second signal (for example, INM) is communicated through a second transmission gate (for example, 212, 214) of the tracking cell from a second latch input node (for example, 145) to a second input node (for example, 210) of the locking cell. In the locking mode, a signal path is maintained (step 502) from the first input node of the locking cell, through a first inverter (for example, 201, 205) of the locking cell, through a second transmission gate (for example, 204, 208) of the locking cell to the second input node (for example, 210) of the locking cell, through a second inverter (for example, 203, 207) of the locking cell, and through a first transmission gate (for example, 202, 206) of the locking cell to the first input node of the locking cell. In one example of the method, operation of the first embodiment transitions back and forth between steps 501 and 502 as the state of the differential clock signal (VOP, VON) switches.

Figure 19:
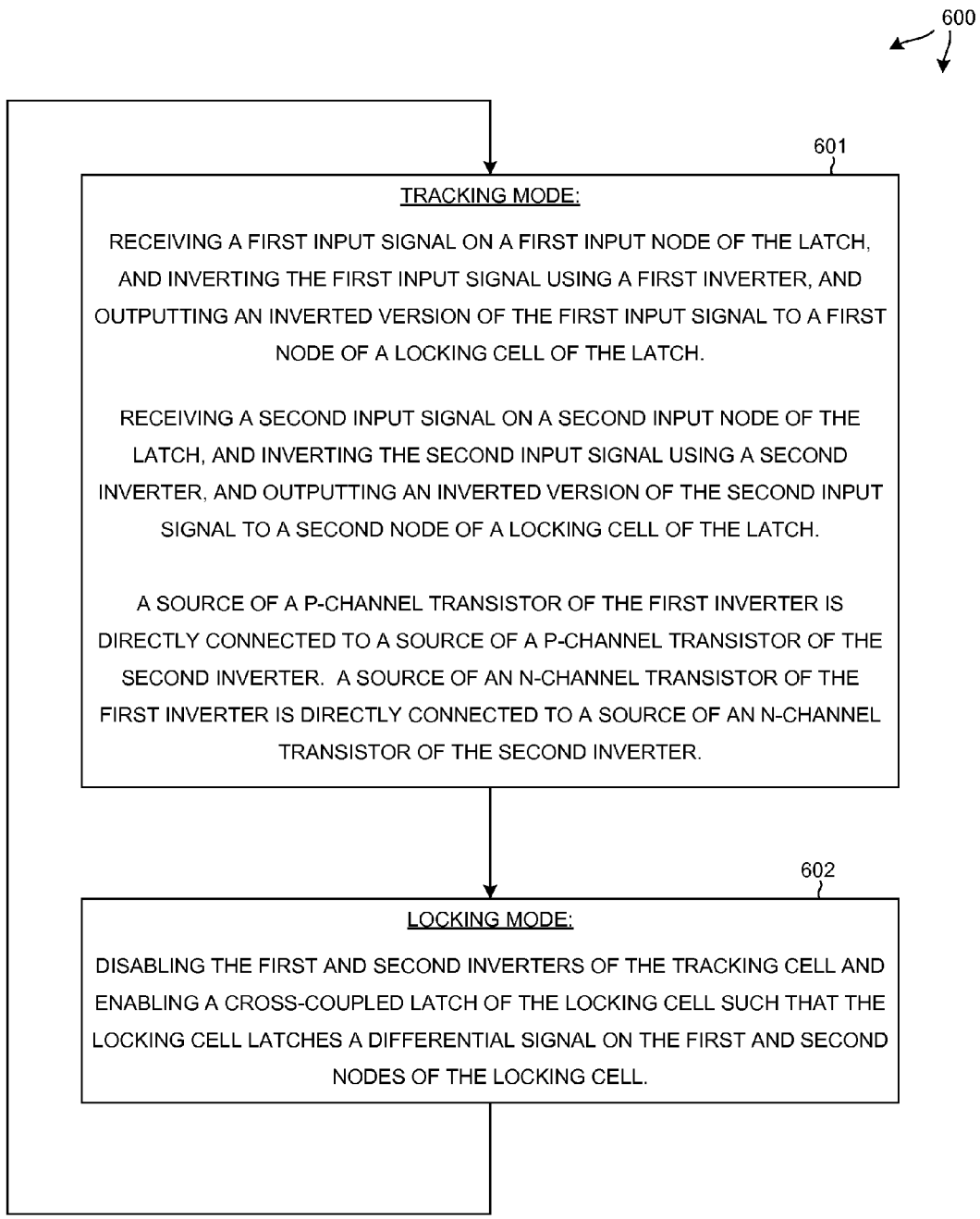
FIG. 19 is a flowchart of a method 600 of operation of the second embodiment of FIG. 12 and of the third embodiment of FIG. 15.

FIG. 19 is a flowchart of a method 600 of operation of the second embodiment of FIG. 12 and of the third embodiment of FIG. 15. In the tracking mode, the first input signal (for example, INP) is received (step 601) on first input node (for example, 144), and is inverted by first inverter (for example, 309, 315) such that an inverted version of the first input signal is output to a first node (for example, 148) of the locking cell. Similarly, the second input signal (for example, INM) is received on second input node (for example, 145), and is inverted by second inverter (for example, 310, 316) such that an inverted version of the second input signal is output to a second node (for example, 149) of the locking cell. The sources of the P-channel pullup transistors of the first and second inverters are directly connected together. Similarly, the sources of the N-channel pulldown transistors of the first and second inverters are directly connected together. In the locking mode, the first and second inverters of the tracking cell are disabled (step 602) and the cross-coupled latch (for example, 301-306) of the locking cell is enabled such that the locking cell latches a differential signal on the first and second nodes (for example, 148, 149) of the locking cell. In one example of the method, operation of the circuit transitions from step 601 to 602 and back again depending on the state of the differential clock signal VOP, VON.

FIG. 20 is a table that sets forth approximate comparative performance parameters for the three embodiments set forth above. In one advantageous aspect, the first embodiment of FIGS. 9-11 has only one transistor in the input signal paths to the input nodes of the locking cell. Moreover, this transistor is one of two parallel-connected transistors of a transmission gate. For example, input signal INP on node 144 need only pass through one transistor (transistor 213 or 211) on its way to the input node 209 of the locking cell. In contrast, in the second embodiment of FIG. 12, an input signal must pass through two transistors. For example, input signal INP on node 144 passes through transistor 311 and 309 in order to switch the signal level on node 148. The first embodiment has a relative speed advantage as compared to the second embodiment. As set forth in the table of FIG. 18, in relative terms, if the first embodiment of FIG. 9 has a maximum operating frequency of 2×, then the second embodiment of FIG. 12 has a maximum operating frequency of 1.5×.

In the second embodiment of FIG. 12, the sources of transistors 309 and 310 are directly connected to the supply voltage conductor 307, whereas in the third embodiment of FIG. 15 the sources of transistors 409 and 410 are coupled to the supply voltage through enable transistor 411 when enable transistor 411 is on. In a switching condition, the circuit of FIG. 12 allows a larger Vgs to appear across transistors 309 and 310 because there is no voltage drop across a fixed Rds (on) of an enable transistor. In the third embodiment of FIG. 15, on the other hand, there is a voltage drop across enable transistor 411 when current flows through enable transistor 411 and this voltage drop serves to decrease the effective Vgs across transistors 409 and 410 in a switching condition. The second embodiment of FIG. 12 can therefore operate from a lower supply voltage for a given operating frequency as compared to the third embodiment of FIG. 15. As set forth in the table of FIG. 18, in relative terms, if the second embodiment of FIG. 12 can operate with a supply voltage down to 1×, then the third embodiment of FIG. 15 only can operate with a supply voltage down to 1.2×.

Figure 1:
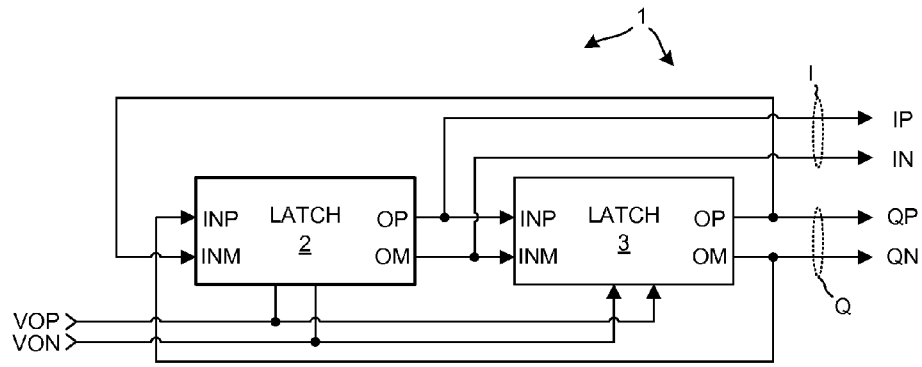
FIG. 1 (Prior Art) is a diagram of a conventional divide-by-two circuit that outputs quadrature signals.
Figure 2:
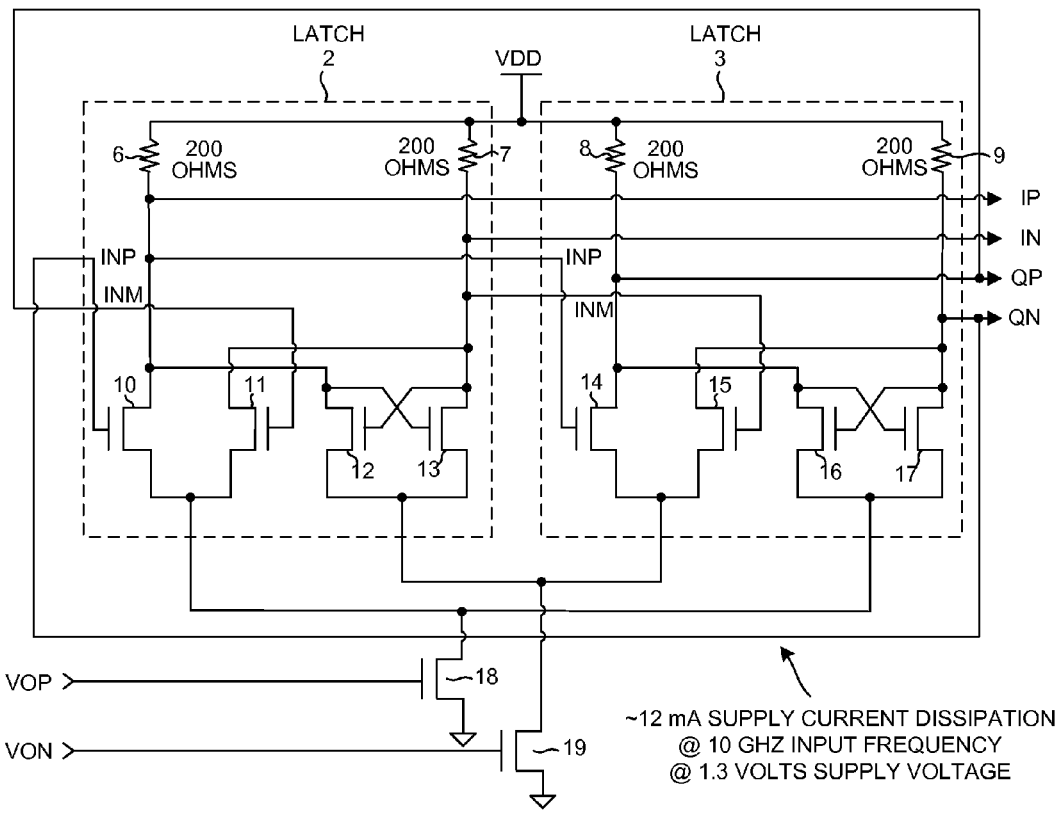
FIG. 2 (Prior Art) is a diagram of the conventional divide-by-two circuit realized using CML logic.
Figure 3:
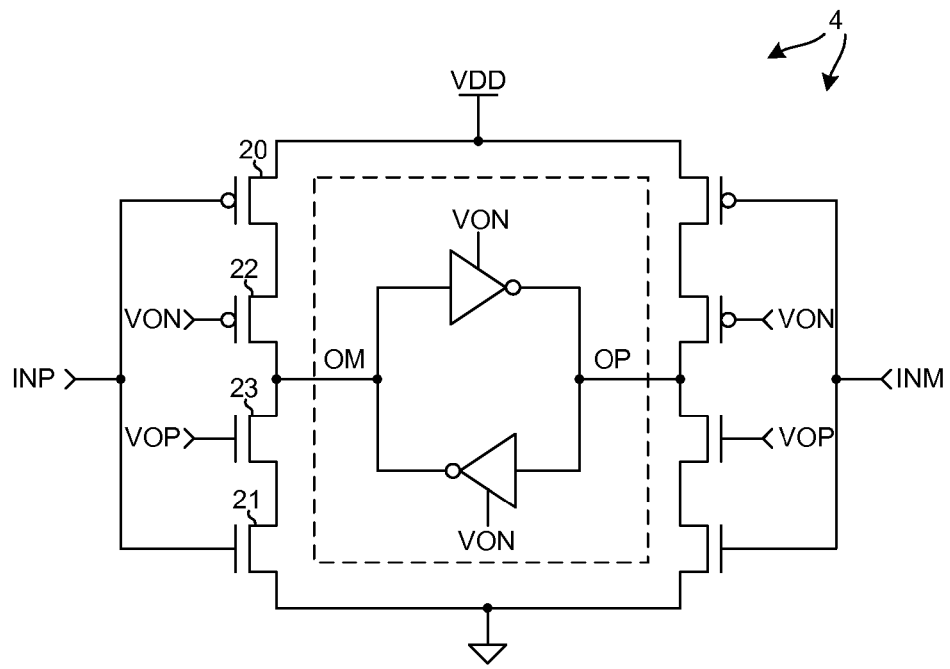
FIG. 3 (Prior Art) is a circuit diagram of a first type of conventional complementary logic latch.
Figure 4:
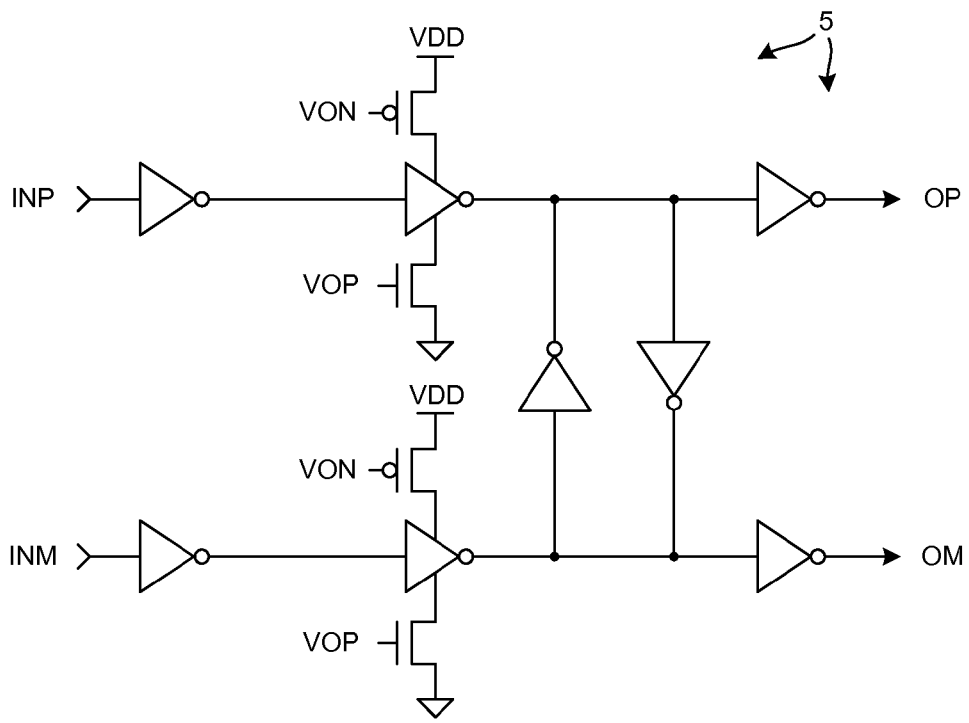
FIG. 4 (Prior Art) is a circuit diagram of a second type of conventional complementary logic latch.

As indicated in FIG. 9, the first embodiment of FIG. 9 consumes approximately 1.0 mA of supply current when operating at 10 GHz from a 1.3 volt supply voltage, whereas the conventional CML circuit of FIG. 2 consumes much more supply current when operating at the same 10 GHz operating frequency and from the same 1.3 volt supply voltage. The embodiment of FIG. 9 is generally superior to the conventional CML divider of FIG. 2 in terms of power dissipation because the embodiment of FIG. 9 does not require large currents to create sufficient output voltage swings across a resistor. Also, as compared to the conventional complementary logic circuits of FIGS. 3 and 4, the embodiment of FIG. 9 can operate from a lower supply voltage because there are only two transistors in series between the supply voltage and ground, rather than four transistors as in the case of the conventional circuits.

Although certain specific embodiments are described above for instructional purposes, the teachings of this patent document have general applicability and are not limited to the specific embodiments described above. Accordingly, various modifications, adaptations, and combinations of the various features of the described specific embodiments can be practiced without departing from the scope of the claims that are set forth below.

What is claimed is:

1. A differential complementary logic latch comprising:
a locking cell comprising a pair of cross-coupled complementary logic inverters, wherein the latch is operable in a tracking mode and in a locking mode, wherein in the tracking mode the locking cell is disabled such that it does not drive a pair of output nodes, and wherein in the locking mode the latch is enabled such that it does drive the pair of output nodes; and
a tracking cell comprising:
a first input node;
a second input node, wherein in the tracking mode the tracking cell receives a first input signal on the first input node, and inverts the first input signal, and drives an inverted version of the first input signal onto a first node of the pair of output nodes of the locking cell, wherein in the tracking mode the tracking cell receives a second input signal on the second input node, and inverts the second input signal, and drives an inverted version of the second input signal onto a second node of the pair of output nodes of the locking cell, and wherein in the locking mode the tracking cell does not drive the pair of output nodes of the locking cell;
a first P-channel transistor having a source, a drain and a gate, wherein the drain the first P-channel transistor is coupled to the first node of the pair of output nodes of the locking cell;
a second P-channel transistor having a source, a drain and a gate, wherein the drain of the second P-channel transistor is coupled to the second node of the pair of output nodes of the locking cell, and wherein the source of the second P-channel transistor is coupled to the source of the first P-channel transistor;
a first N-channel transistor having a source, a drain and a gate, wherein the drain of the first N-channel transistor is coupled to the drain of the first P-channel transistor of the tracking cell; and a second N-channel transistor having a source, a drain and a gate, wherein the drain of the second N-channel transistor is coupled to the drain of the second P-channel transistor of the tracking cell, wherein a first of the cross-coupled complementary logic inverters of the locking cell includes a P-channel transistor and N-channel transistor, wherein a second of the cross-coupled complementary logic inverters of the locking cell includes a P-channel transistor and N-channel transistor, wherein a source of the P-channel transistor of the first complementary logic inverter is coupled to a source of the P-channel transistor of the second complementary logic inverter, wherein a source of the N-channel transistor of the first complementary logic inverter is coupled to a source of the N-channel transistor of the second complementary logic inverter, wherein the locking cell further comprises a third P-channel transistor having a source, a drain, and a gate, wherein the source of the third P-channel transistor of the locking cell is coupled to a supply voltage node, wherein the drain of the third P-channel transistor of the locking cell is coupled to the sources of the P-channel transistors of the first and second complementary logic inverters of the locking cell, wherein the locking cell further comprises a third N-channel transistor having a source, a drain, and a gate, wherein the source of the third N-channel transistor of the locking cell is coupled to a ground node, wherein the drain of the third N-channel transistor of the locking cell is coupled to the sources of the N-channel transistors of the first and second complementary logic inverters of the locking cell.

2. A differential complementary logic latch comprising:
a locking cell comprising a pair of cross-coupled complementary logic inverters, wherein the latch is operable in a tracking mode and in a locking mode, wherein in the tracking mode the locking cell is disabled such that it does not drive a pair of output nodes, and wherein in the locking mode the latch is enabled such that it does drive the pair of output nodes; and
a tracking cell comprising:
  a first input node;
  a second input node, wherein in the tracking mode the tracking cell receives a first input signal on the first input node, and inverts the first input signal, and drives an inverted version of the first input signal onto a first node of the pair of output nodes of the locking cell, wherein in the tracking mode the tracking cell receives a second input signal on the second input node, and inverts the second input signal, and drives an inverted version of the second input signal onto a second node of the pair of output nodes of the locking cell, and wherein in the locking mode the tracking cell does not drive the pair of output nodes of the locking cell;
  a first P-channel transistor having a source, a drain and a gate, wherein the drain the first P-channel transistor is coupled to the first node of the pair of output nodes of the locking cell;
  a second P-channel transistor having a source, a drain and a gate, wherein the drain of the second P-channel transistor is coupled to the second node of the pair of output nodes of the locking cell, and wherein the source of the second P-channel transistor is coupled to the source of the first P-channel transistor;
  a first N-channel transistor having a source, a drain and a gate, wherein the drain the first N-channel transistor is coupled to the drain of the first P-channel transistor of the tracking cell; and
  a second N-channel transistor having a source, a drain and a gate, wherein the drain of the second N-channel transistor is coupled to the drain of the second P-channel transistor of the tracking cell, wherein the tracking cell further comprises:
    a first circuit that selectively couples the gate of the first P-channel transistor to one of the first input node of the tracking cell and a supply voltage node, wherein in the tracking mode the first circuit couples the gate of the first P-channel transistor to the first input node of the tracking cell, and wherein in the locking mode the first circuit couples the gate of the first P-channel transistor to the supply voltage node;
    a second circuit that selectively couples the gate of the first N-channel transistor to one of the first input node of the tracking cell and a ground node, wherein in the tracking mode the second circuit couples the gate of the first N-channel transistor to the first input node of the tracking cell, and wherein in the locking mode the second circuit couples the gate of the first N-channel transistor to the ground node;
    a third circuit that selectively couples the gate of the second P-channel transistor to one of the second input node of the tracking cell and the supply voltage node, wherein in the tracking mode the third circuit couples the gate of the second P-channel transistor to the second input node of the tracking cell, and wherein in the locking mode the third circuit couples the gate of the second P-channel transistor to the supply voltage node; and
    a fourth circuit that selectively couples the gate of the second N-channel transistor to one of the second input node of the tracking cell and a ground node, wherein in the tracking mode the fourth circuit couples the gate of the second N-channel transistor to the second input node of the tracking cell, and wherein in the locking mode the fourth circuit couples the gate of the second N-channel transistor to the ground node.

3. The differential complementary logic latch of claim 2, wherein the first circuit includes a P-channel transistor having a source coupled to the supply voltage node and having a drain coupled to the gate of the first P-channel transistor, wherein the second circuit includes an N-channel transistor having a source coupled to the ground node and having a drain coupled to the gate of the first N-channel transistor, and
wherein the third circuit includes a P-channel transistor having a source coupled to the supply voltage node and having a drain coupled to the gate of the second P-channel transistor, wherein the fourth circuit includes an N-channel transistor having a source coupled to the ground node and having a drain coupled to the gate of the second N-channel transistor.

4. A differential complementary logic latch comprising:
a locking cell comprising a pair of cross-coupled complementary logic inverters, wherein the latch is operable in a tracking mode and in a locking mode, wherein in the tracking mode the locking cell is disabled such that it does not drive a pair of output nodes, and wherein in the locking mode the latch is enabled such that it does drive the pair of output nodes; and a tracking cell comprising:
   a first input node;
   a second input node, wherein in the tracking mode the tracking cell receives a first input signal on the first input node, and inverts the first input signal, and drives an inverted version of the first input signal onto a first node of the pair of output nodes of the locking cell, wherein in the tracking mode the tracking cell receives a second input signal on the second input node, and inverts the second input signal, and drives an inverted version of the second input signal onto a second node of the pair of output nodes of the locking cell, and wherein in the locking mode the tracking cell does not drive the pair of output nodes of the locking cell;
   a first P-channel transistor having a source, a drain and a gate, wherein the drain the first P-channel transistor is coupled to the first node of the pair of output nodes of the locking cell;
   a second P-channel transistor having a source, a drain and a gate, wherein the drain of the second P-channel transistor is coupled to the second node of the pair of output nodes of the locking cell, and wherein the source of the second P-channel transistor is coupled to the source of the first P-channel transistor;
   a first N-channel transistor having a source, a drain and a gate, wherein the drain the first N-channel transistor is coupled to the drain of the first P-channel transistor of the tracking cell; and
   a second N-channel transistor having a source, a drain and a gate, wherein the drain of the second N-channel transistor is coupled to the drain of the second P-channel transistor of the tracking cell, wherein the tracking cell further comprises:
      a third P-channel transistor having a source, a drain and a gate, wherein the source of the third P-channel transistor is coupled to a supply voltage node, wherein the drain of the third P-channel transistor is coupled to the sources of the first and second P-channel transistors, and wherein the third P-channel transistor is conductive in the tracking mode but is nonconductive in the locking mode; and
      a third N-channel transistor having a source, a drain and a gate, wherein the source of the third N-channel transistor is coupled to a ground node, wherein the drain of the third N-channel transistor is coupled to the sources of the first and second N-channel transistors, and wherein the third N-channel transistor is conductive in the tracking mode but is nonconductive in the locking mode.

5. A method comprising:

in a tracking mode of operation of a latch, receiving a first input signal on a first input node of the latch, and inverting the first input signal using a first inverter of a tracking cell, and outputting an inverted version of the first input signal to a first node of a locking cell of the latch;

in the tracking mode of operation of the latch, receiving a second input signal on a second input node of the latch, and inverting the second input signal using a second inverter of the tracking cell, and outputting an inverted version of the second input signal to a second node of the locking cell of the latch, wherein a source of a P-channel transistor of the first inverter is directly connected to a source of a P-channel transistor of the second inverter, and wherein a source of an N-channel transistor of the first inverter is directly connected to a source of an N-channel transistor of the second inverter;

in the tracking mode coupling the source of the P-channel transistor of the first inverter and the source of the P-channel transistor of the second inverter through a first enable transistor to a supply voltage conductor, and in the locking mode turning off the first enable transistor thereby decoupling the source of the P-channel transistor of the first inverter and the source of the P-channel transistor of the second inverter from the supply voltage conductor;

in the tracking mode coupling the source of the N-channel transistor of the first inverter and the source of the N-channel transistor of the second inverter through a second enable transistor to a ground conductor, and in the locking mode turning off the second enable transistor thereby decoupling the source of the N-channel transistor of the first inverter and the source of the N-channel transistor of the second inverter from the ground conductor; and in a locking mode of operation of the latch, disabling the first and second inverters of the tracking cell and enabling a cross-coupled latch of the locking cell such that the locking cell latches a differential signal on the first and second nodes of the locking cell, and wherein the cross-coupled latch of the locking cell is disabled in the tracking mode.

6. The method of claim 5, wherein the first input signal and the second input signal together are a differential input signal.

7. The method of claim 5, wherein the differential signal on the first and second nodes of the locking cell is a differential output signal of the latch.

8. The method of claim 5, wherein the sources of P-channel transistors of the first and second inverters are directly connected to the supply voltage conductor and are supplied with a supply voltage during both the tracking and locking modes, and wherein the sources of N-channel transistors of the first and second inverters are directly connected to the ground conductor and are grounded during both the tracking and locking modes.

9. A method comprising:

in a tracking mode of operation of a latch, receiving a first input signal on a first input node of the latch, and inverting the first input signal using a first inverter of a tracking cell, and outputting an inverted version of the first input signal to a first node of a locking cell of the latch;

in the tracking mode of operation of the latch, receiving a second input signal on a second input node of the latch, and inverting the second input signal using a second inverter of the tracking cell, and outputting an inverted version of the second input signal to a second node of the locking cell of the latch, wherein a source of a P-channel transistor of the first inverter is directly connected to a source of a P-channel transistor of the second inverter, and wherein a source of an N-channel transistor of the first inverter is directly connected to a source of an N-channel transistor of the second inverter;

in a locking mode of operation of the latch, disabling the first and second inverters of the tracking cell and enabling a cross-coupled latch of the locking cell such that the locking cell latches a differential signal on the first and second nodes of the locking cell, and wherein the cross-coupled latch of the locking cell is disabled in the tracking mode;

in the locking mode decoupling a gate of the P-channel transistor of the first inverter from the first input node of the latch and coupling the gate of the P-channel transistor of the first inverter to the supply voltage conductor;

in the locking mode decoupling a gate of the P-channel transistor of the second inverter from the second input node of the latch and coupling the gate of the P-channel transistor of the second inverter to the supply voltage conductor;

in the locking mode decoupling a gate of the N-channel transistor of the first inverter from the first input node of the latch and coupling the gate of the N-channel transistor of the first inverter to the ground conductor; and in the locking mode decoupling a gate of the N-channel transistor of the second inverter from the second input node of the latch and coupling the gate of the N-channel transistor of the second inverter to the ground conductor.

* * * * *